United States Patent
Chou et al.

(10) Patent No.: US 9,471,738 B2
(45) Date of Patent: Oct. 18, 2016

(54) METHOD AND APPARATUS FOR CAPACITANCE EXTRACTION

(71) Applicant: TAIWAN SEMICONDUCTOR MANUFACTURING COMPANY, LTD., Hsinchu (TW)

(72) Inventors: Chih-Cheng Chou, New Taipei (TW); Tsung-Han Wu, Hsinchu (TW); Ke-ying Su, Taipei (TW); Hsien-Hsin Sean Lee, Duluth, GA (US); Chung-Hsing Wang, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/615,084

(22) Filed: Feb. 5, 2015

(65) Prior Publication Data
US 2016/0232270 A1    Aug. 11, 2016

(51) Int. Cl.
*G06F 9/455*    (2006.01)
*G06F 17/50*    (2006.01)

(52) U.S. Cl.
CPC ....... *G06F 17/5072* (2013.01); *G06F 17/5077* (2013.01); *G06F 17/5081* (2013.01)

(58) Field of Classification Search
CPC .................................................. G06F 17/5031
USPC ........................................................ 716/113
See application file for complete search history.

(56) References Cited

U.S. PATENT DOCUMENTS

| | | | |
|---|---|---|---|
| 8,601,416 B2 | 12/2013 | Kuo et al. | |
| 8,689,157 B1 * | 4/2014 | Lo | G06F 17/5081 700/110 |
| 8,732,640 B1 * | 5/2014 | Krishnan | G06F 17/5081 716/110 |
| 8,762,900 B2 | 6/2014 | Shin et al. | |
| 8,775,993 B2 | 7/2014 | Huang et al. | |
| 8,826,213 B1 * | 9/2014 | Ho | G06F 17/5081 716/110 |
| 8,887,116 B2 | 11/2014 | Ho et al. | |
| 2006/0053394 A1 * | 3/2006 | Batterywala | G06F 17/5081 716/115 |
| 2009/0007035 A1 * | 1/2009 | Su | G01R 31/2853 716/106 |
| 2011/0078642 A1 * | 3/2011 | Elfadel | G06F 17/5036 716/106 |

(Continued)

*Primary Examiner* — Suresh Memula
(74) *Attorney, Agent, or Firm* — Hauptman Ham, LLP

(57) ABSTRACT

A method comprises processing a layout of an integrated circuit to determine one or more attributes of one or more components of the integrated circuit. The method also comprises extracting one or more process parameters from a process file associated with manufacturing the integrated circuit. The one or more process parameters are extracted from the process file based on a computation of one or more logic functions included in the process file. The computation is based on the one or more attributes. The method further comprises calculating a capacitance value between at least two components of the integrated circuit based on the one or more process parameters and a capacitance determination rule included in the process file. At least one of the one or more process parameters, the one or more logic functions, or the capacitance determination rule is editable based on a user input.

20 Claims, 11 Drawing Sheets

(56) References Cited

U.S. PATENT DOCUMENTS

| | | | |
|---|---|---|---|
| 2012/0022846 A1* | 1/2012 | White | G06F 17/5081 703/14 |
| 2012/0185807 A1* | 7/2012 | Tsai | G06F 17/5081 716/52 |
| 2013/0091480 A1* | 4/2013 | Horlacher | G06F 17/5031 716/113 |
| 2014/0101623 A1 | 4/2014 | Chen et al. | |
| 2014/0123086 A1* | 5/2014 | Buck | G06F 17/5081 716/102 |
| 2014/0201692 A1 | 7/2014 | Chen et al. | |
| 2014/0237435 A1 | 8/2014 | Chen et al. | |
| 2014/0282337 A1 | 9/2014 | Yuh et al. | |
| 2014/0304670 A1 | 10/2014 | Su et al. | |
| 2014/0310675 A1 | 10/2014 | Liu et al. | |
| 2014/0325464 A1 | 10/2014 | Hsu et al. | |

* cited by examiner

METHOD AND APPARATUS FOR CAPACITANCE EXTRACTION

BACKGROUND

Semiconductor devices are used in a variety of electronic applications, such as personal computers, cell phones, digital cameras, other electronic equipment, or other suitable devices. Semiconductor devices comprise integrated circuits (IC) that include components such as transistors, diodes, resistors, capacitors, or other suitable circuit components. Some transistors are, for example, metal-oxide-semiconductor field-effect transistors (MOSFET) or fin field-effect transistors (FinFET). IC designers and manufacturers are challenged, as IC's increase in complexity, to produce IC's that function as intended.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
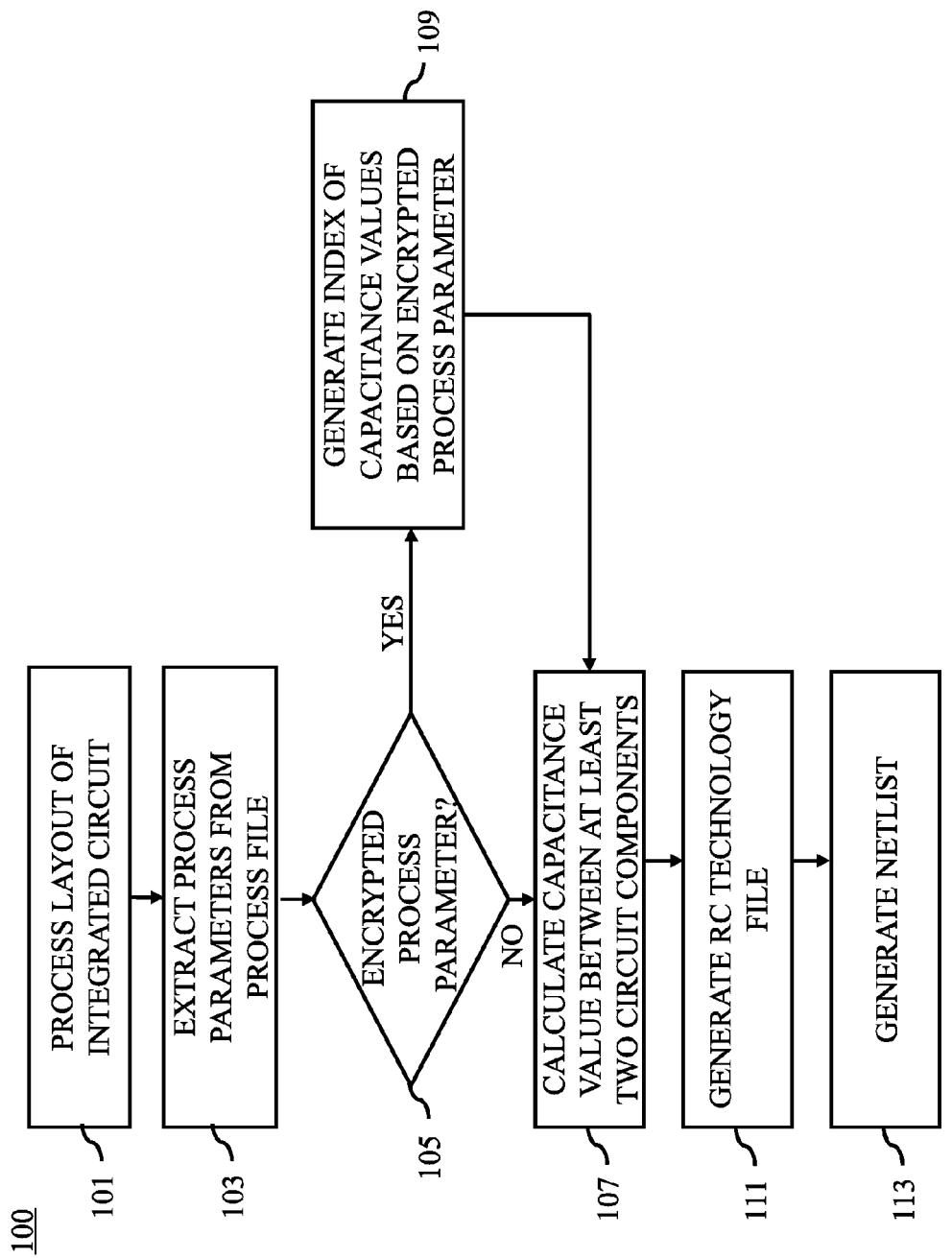
FIG. 1 is a flow chart of a method of extracting capacitance values between at least two components of a designed integrated circuit (IC) using a programmable resistance capacitance (RC) technology file, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An integrated circuit (IC) is often created by a design process starting with a software description, e.g., in a programming language such as C or VHDL, of a functionality of the circuit. The software description is then synthesized to interconnected gate-level hardware elements. Next, the hardware elements and the connections are geometrically laid out, represented as placements of geometric shapes, often referred to as an IC layout, on a variety of layers to be fabricated on semiconductor wafers. ICs are often formed on semiconductor wafers by depositing many types of thin films of materials over the semiconductor wafers. The thin films are patterned to form the components of the IC such as transistors, diodes, resistors, capacitors, or other suitable circuit components. In general, the geometric shapes are polygons of various dimensions, representing conductive or non-conductive features of the IC located in different layers over the semiconductor wafers. The IC layout is then subjected to a design-rule check (DRC) and verified to be equivalent with the desired design schematic via a layout versus schematic (LVS) check.

As ICs increase in complexity and become smaller in physical size, the components of the IC are closer in proximity to one another. Parasitic circuit elements that are often related to the closeness of various IC components to one another affect the performance of the IC. A resistance and capacitance (RC) extraction step, also called as parasitic extraction, is often performed following the DRC and LVS checks, to extract electrical characteristics of the layout. The RC extraction step converts the layout back into representative electrical circuit elements, and measures the actual shapes and spaces in the layers of the layout to predict the resulting electrical characteristics of a manufactured chip. The electrical characteristics that are commonly extracted from the layout include capacitance and resistance in the components of the IC and on various interconnections between the components, which are generally referred to as "nets." The nets electrically connect the components of the IC.

Electronic Design Automation ("EDA") tools are often used in the IC design process to handle the complexity of the design, and to perform the DRC, LVS, and RC extraction. Some EDA tools for RC extraction, or RC extraction tools, have issues with accuracy and speed. Some EDA tools have difficulties processing FinFET designs as well. An RC extraction tool often cooperates with an RC technology file to extract RC values from the layout of an IC. Then, a post-layout simulation is performed to verify circuit performance and/or function. For example, some post-layout simulations model the parasitic capacitance, inductance and resistance between components of the IC (e.g., as represented by the interconnections in the IC) so that some performance issues such as timing, noise and reliability are able to be accurately assessed. The degree of accuracy of the post-layout simulation is dependent on having an accurate RC technology file.

RC technology files are usually generated by EDA tools based on a simulation program with integrated circuit emphasis (SPICE) model file received from an IC foundry. The EDA tool calculates the parasitic capacitance values related to each interconnection by way of a field solver. The outcome of the field solver is saved as an RC technology file.

RC technology file generation is timing consuming. In addition, for an IC foundry, different clients often have slightly different interconnection structures. So, IC foundries usually dedicate one RC technology file for each interconnection structure, even if the differences between some interconnection structures are minimal. For example, in multiple patterning technologies that use two or more masks to manufacture a layer of an IC, some process behavior sensitivities are different in different technology nodes. Sometimes, a metal pattern formed by a mask represented by a color A and a metal pattern formed by a mask represented by a color B sometimes have different metal thickness that have different sensitivity impacts on RC modeling. Because RC technology files are customized for IC foundries and individual RC technology files are dedicated for each interconnect structure, for new process effects such as a change in color A and/or color B metal thickness, a new RC technology file is usually generated. The time required to generate a new RC technology file, however, slows down the IC design process, as well as the IC production cycle.

FIG. 1 is a flowchart of a method 100 of extracting capacitance values between at least two components of a designed IC using a programmable RC technology file, in accordance with one or more embodiments.

Figure 11:
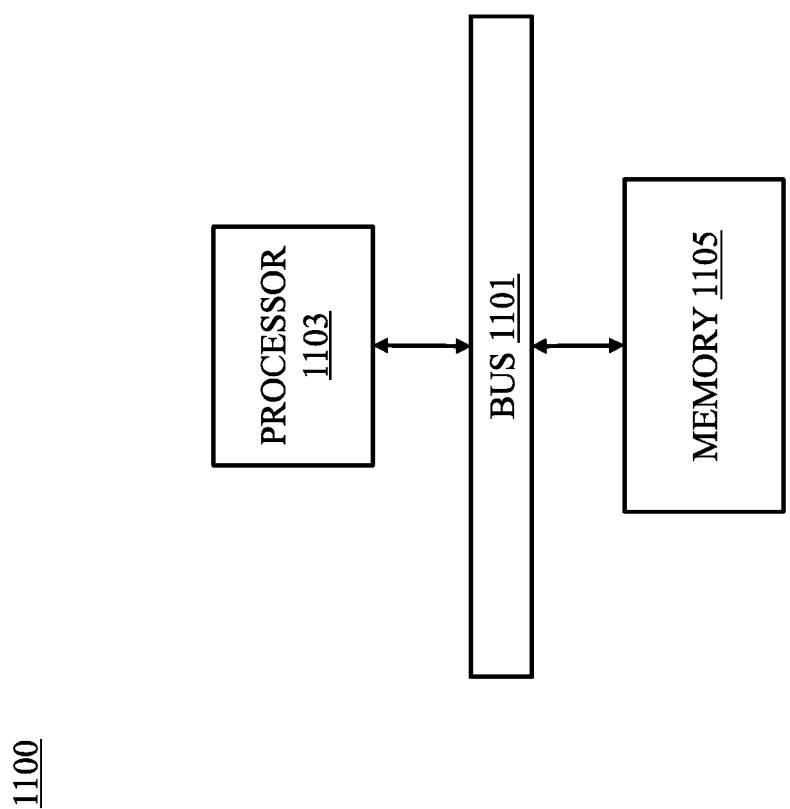
FIG. 11 is a functional block diagram of a computer or processor-based system upon which or by which at least one embodiment is implemented.

Method 100 is performed by at least one computer such as processor-based system 1100 (FIG. 11). In some embodiments, the computer is an EDA tool. In some embodiments, the computer is an RC tool. In other embodiments, the computer, by way of a processor, is configured to execute an EDA tool and/or an RC tool.

Method 100 begins with step 101 in which the computer processes a layout of an IC to determine one or more attributes of one or more components of the IC. Such components comprise, for example, transistors, capacitors, resistors, diodes or other suitable electrical components of an IC. The IC layout defines the specific dimensions of the components of the IC and/or sub-components thereof such as gates, wells, diffusion areas, oxidation regions, capacitors, contacts, vias, passivation openings, isolation regions, interconnects, and/or other device elements. The layout usually represents the components of the IC as polygons or other geometric shapes created by an EDA tool, for example. The layout of the IC processed by the computer is a layout file.

The one or more attributes comprise a layout dimension of at least one of the one or more components. A layout dimension is, for example, a length, a width, or a thickness of a component of the IC, a distance or spacing between two components of the IC, a position of a component of the IC on a wafer or substrate, or some other suitable dimension associated with a layout representation of a designed IC. In some embodiments, the layout dimension is an ideal measurement of a component of the IC, an ideal distance between two components of the IC, or an ideal position description of a component of the IC. Layout dimensions are referred to herein by an identification tag "_id" for ease of discussion. For example, a layout width is referred to herein as "W_id." In some embodiments, layout dimensions are referred to by a different identification tag.

In some embodiments, the one or more attributes comprise a mask pattern usable to manufacture the one or more components of the IC. For example, if a layout of the IC calls for using one or two masks of a mask A and a mask B, a layout pattern or arrangement of mask A and mask B in the IC layout is represented as AAA, BBB, ABA, BAB, or some other suitable combination of mask A and mask B.

In step 103, the computer extracts one or more process parameters from a process file associated with manufacturing the IC. The process file comprises information such as fabrication processes associated with manufacturing an IC based on the IC layout, structure profiles, device or circuit defined capacitance, inductance, and resistance, or other suitable process parameter information such as process control parameters, and process attributes available during the fabrication process, or any other suitable information needed to fabricate the IC.

In some embodiments, the process file also comprises a process dimension of the at least one of the one or more components. A process dimension is, for example, an actual dimension such as a length, width, a thickness or a distance or spacing between two components of the IC based on a physical fabrication of the IC. For example, a process dimension based on a fabricated IC is an actual silicon dimension, or another dimension associated with a physical material by which one or more components of the IC is fabricated. As such, in some embodiments, the one or more process parameters comprise a process dimension such as a length, a width, a thickness, or other suitable dimension, spacing, or other suitable process parameter such as process variation information associated with manufacturing each of the one or more components.

In some embodiments, the process parameters comprise process variation information that defined how a process dimension (e.g., a dimension of a physically manufactured component of an IC) differs from a corresponding layout dimension. For example, based on process variation information included in a process file, an IC designer is able to understand whether a layout dimension of X will be fabricated at a foundry as X, or if the foundry will fabricate the component having a dimension of X+Y, where Y is a variation introduced by the manufacturing process. This process variation information is useful when extracting capacitance values from a designed IC to simulate circuit performance in the design process. Process dimensions are referred to herein by an identification tag "_si" for ease of discussion. For example, a process width is referred to herein as "W_si." In some embodiments, process dimensions are referred to by a different identification tag.

In some embodiments, at least one process parameter of the one or more process parameters is extracted based on a first parameter extraction rule or a second parameter extraction rule. The first parameter extraction rule instructs the computer to determine the at least one process parameter using a lookup table. The second process parameter extraction rule instructs the computer to determine the at least one process parameter using a process parameter determination function.

The lookup table, for example, comprises a set of searchable solutions that match a given data set. The process parameter determination function, for example, calculates an output using a given value as an input. The given value is, for example, an attribute of the one or more circuit components of the IC determined from the layout of the IC by the computer.

In some embodiments, the given value is based on a user input. In some embodiments, the one or more process parameters are extracted from the process file based on one or more logic functions. At least one of the one or more logic functions is included in the process file. In some embodiments, the computation is based on at least one of the one or more attributes of the one or more components of the IC. Some example logic functions for determining a process width W_si include, for example:

FoW=if width in region1, then W_si=FoW_1, else FoW_2

FoW_1=if in x_direction, then W_id+dW_si1, else Wid, where dW_si1=width bias table.

In the above example logic functions, FoW is a function of width logic function usable to determine which of two example logic functions, FoW_1 or FoW_2, is usable by the computer to determine the process width W_si of the circuit component. In the above example logic functions, to determine the process width W_si of the circuit component at issue, the computer determines if the circuit component, or at least the width of the circuit component, is in a first region, region 1, of the IC. Region 1 is, for example, one of at least two areas of a semiconductor substrate over which the IC is laid out. If the width of the circuit component is in region 1, then the computer uses logic function, FoW_1, to determine the process width W_si. If the computer, in this example, determines that the component width is not in region 1, then the computer uses a different logic function, FoW_2 (the details of which are not shown), to determine the process width W_si. If the computer determines that logic function FoW_1 is usable to determine the process width W_si based on the determination that the component width is in region 1, then the computer determines if the component width is extending in the x-direction. If the component width is determined to be in the x-direction, then the computer calculates the process width W_si of the component based on the layout width W_id and a process variation value dW_si1 queried from a lookup table associated with the process for manufacturing the circuit component. The lookup table comprises predetermined values that are process variations which, in this example, are to be added to the layout width W_id if the circuit component width is in the first region, region 1, of the IC. If the computer determines that the component width extends in a direction different from the x-direction, then the computer determines that the process width W_si is equal to the layout width W_id.

In some embodiments, the process file comprises an instruction to use the layout dimension for extracting at least one of the one or more process parameters or for calculating a capacitance value between at least two components of the IC. If the process file comprises a process dimension, the process file further comprises an instruction to use the process dimension for extracting at least one of the one or more process parameters or for calculating the capacitance value. In some embodiments, the instruction to use the process dimension is selectively useable in place of the instruction to use the layout dimension. For example, based on a user input received by way of a user interface associated with the computer, the process dimension or the layout dimension is selected to be used for calculating the capacitance value.

In some embodiments, the process dimension is calculated based on the process variation information and the layout dimension. In some embodiments, if a process dimension is different from a corresponding layout dimension, then the process dimension is used for calculating a capacitance value.

In step 105, the computer determines if the process file includes at least one process parameter, logic function, instruction, rule, table, or index of capacitance values is in an encrypted format. If no, then the process continues to step 107. If yes, then the process continues to step 109.

In step 107, the computer calculates a capacitance value between at least two components of the IC based on the process parameters and a capacitance determination rule included in the process file. In some embodiments, the process file comprises a capacitance determination function and an index of capacitance values. The capacitance determination rule used to determine the capacitance value is one of a first capacitance determination rule or a second capacitance determination rule. The first capacitance determination rule instructs the computer to calculate the capacitance value using the capacitance determination function. The second capacitance determination rule instructs the computer to calculate the capacitance value based on the index of capacitance values. In some embodiments, the first capacitance determination rule or the second capacitance determination rule is applied based on the computation of the one or more logic functions included in the process file. The index of capacitance values, for example, comprises a set of searchable solutions that match a given data set. A process parameter determination function, for example, calculates an output using a given value as an input.

In some embodiments, to determine the given data set used to search the index of capacitance values, the computer matches a mask pattern with a mask pattern having assigned capacitance values in the index of capacitance values. Alternatively, the computer compares layout or process dimensions of the component that are based on the layout file or the process file with layout or process dimensions of a similar component that is stored in the index of capacitance values to find usable dimensions for the given data set. If a similar component is found, the layout or process dimensions of the similar component are usable by the computer to determine a pre-calculated capacitance value for the components of the IC.

In some embodiments, the capacitance determination rule used to determine the capacitance value instructs the computer to apply a capacitance determination method such as a one-dimensional (1D) method, a two dimensional (2D) method, a three-dimensional (3D) method, a quasi-three dimensional (2.5D) method, or another suitable method. A 1D capacitance determination method calculates the capacitance based on a linear formula in a single direction, e.g., a length direction. A 2D capacitance determination method calculates the capacitance based on a planar area of the components which is a more accurate geometry modeling and numerical techniques than a 1D method. The 2D method ignores three dimensional details and assumes that the geometries of the components are uniform in one dimension. The 2.5D capacitance extraction method is based on a 2D scanning approach. In the 2.5D method, three dimensional structures are cut into 2D slides along a scanning direction. Once the 2D cross-sections are formed, the 2D capacitance on each cross section is determined. Then, the corresponding 2.5D, or quasi-3D, capacitance is constructed based on the 2D cross-section capacitance information. The 3D capacitance determination method is based on integral equations or differential equations, using full three dimensional geometry information that describes the IC in accordance with the attributes extracted from the layout file or the process file, for example.

One or more of the process parameters, the logic functions, or the capacitance determination rule comprises computer code readable by the computer and/or an RC tool executed by the computer. In some embodiments, the computer code is readable by a RC tool external to the computer.

In some embodiments, the computer readable code comprises one or more of +, −, *, /, ^, √; logic operations such as "IF", "THEN", "ELSEIF", "AND", "OR"; or an other suitable operator or logic operation. At least one of the one or more process parameters, the one or more logic functions, or the capacitance determination rule is selectively editable based on a user input received by way of a user interface associated with the computer. User interaction with the user interface to edit one or more of the process parameters, logic functions or capacitance determination rules, for example, by way of editing the computer readable code makes the process file and/or a RC technology file generated based on the layout of the IC and/or the process file programmable.

If the computer determines in step 105 that at least one of the process parameters, logic functions, instructions, rules, tables or index of capacitance values is in an encrypted format, method 100 proceeds to step 109 before step 107. In some embodiments, at least one of the process parameters, logic functions, instructions, or rules used for calculating the capacitance value is in an encrypted format in a user-defined file. In some embodiments, the user-defined file is an executable file that when executed by the computer, outputs a process parameter, logic function, instruction, a rule, or some other output result usable by the computer to extract a process parameter, calculate the capacitance value, or generate the netlist. In some embodiments, the user-defined file comprises the index of capacitance values in an encrypted format, and the calculated capacitance value is extracted from the encrypted index of capacitance values. In some embodiments, the computer generates the index of capacitance values based on the process parameters, logic functions, instructions and/or rules included in the user-defined file.

In step 109 the computer generates the index of capacitance values based on the at least one encrypted process parameter or the output result of the executable file. The capacitance determination rule used in step 107 to determine the capacitance value, accordingly, instructs the computer to calculate the capacitance value based on the index of capacitance values included in the user-defined file. In some embodiments, if the index of capacitance values remains in an encrypted format and the capacitance value is calculated based on the output result of the executable file, then the capacitance value is calculated based on a capacitance determination function.

In some embodiments, at least one of the logic functions used for extracting at least one of the one or more process parameters is in an encrypted format. If one or more process parameters or one or more logic functions are in an encrypted format, an IC designer is able to keep certain process or IC design information confidential from an IC foundry, for example. Some example logic functions that are optionally included in the user-defined file include function of density FoD logic functions, function of thickness FoT logic functions, table of thickness ToT logic functions that instruct the computer to use a lookup table for determining an output of the ToT function, or other suitable logic functions.

Some example FoD logic functions include:
Global drawn density: FoD_Gid=D_id
Global silicon density: FoD_Gsi=D_id*(1+dW_si1+dW_si1^2)
Local drawn density: FoD_Lid=W_id/(W_id+S_id)
Local silicon density: FoD_Lsi=W_si/(W_id+S_id)
Some FoT logic functions include:
Global drawn density: FoD_Gid=D_id
Global silicon density: FoD_Gsi=D_id*(1+dW_si1+dW_si1^2)
Local drawn density: FoD_Lid=W_id/(W_id+S_id)
Local silicon density: FoD_Lsi=W_si/(W_id+S_id)
Some ToT logic functions include:
Global drawn density: FoD_Gid=D_id
Global silicon density: FoD_Gsi=D_id*(1+dW_si1+dW_si1^2)
Local drawn density: FoD_Lid=W_id/(W_id+S_id)
Local silicon density: FoD_Lsi=W_si/(W_id+S_id)

In some embodiments, one or more of the above-example logic functions is referred to as being included in the process file or in the user-defined file are included in the process file in an unencrypted format. In some embodiments, one or more of the above-example logic functions referred to as being included in the process file or in the user-defined file are included in the user-defined file in an encrypted format. In some embodiments, one or more of the process file or the user-defined file include different logic functions that are either included in the process file or the user-defined file as default functions or based on a user input. For example, in some embodiments, a different process parameter is of interest to an IC designer, so the IC designer modifies the process file to include a computer readable logic function that is used to determine the thickness of a component of the IC based on a process width of the component, a location of the component, a mask pattern used to make the component, and an etch depth. As such, the logic functions, rules and instructions included in the process file are able to take any form, yield any desired result, and be based on any input values for obtaining the desired result, so long as the RC tool is capable of reading and processing the logic function as written.

In step 111, the computer generates the RC technology file based on the one or more attributes extracted from the layout of the IC and/or the one or more process parameters extracted from the process file. The generated RC technology file is a programmable RC technology file, because one or more of the process parameters, logic function or capacitance determination rules is selectively editable by a user input. The generated RC technology file comprises one or more of a process parameter of the one or more process parameters or the calculated capacitance value.

In step 113, the computer generates a netlist describing one or more connections between the at least two components of the integrated circuit. The generated netlist comprises the capacitance value. In some embodiments, the capacitance value included in the netlist is based on the generated RC technology file. In some embodiments, a netlist of components of another IC is generated based on the RC technology file generated in step 111. The RC technology file generated in step 111 is optionally stored among other RC technology files in a memory associated with the computer. The capacitance values to be included in the netlist generated in step 113 are then extracted from a stored RC technology file for inclusion in the netlist.

In some embodiments, the computer is configured to generate instructions that are usable for forming a mask or for manufacturing the IC based on the netlist generated in step 113.

By providing the capability of modifying the process file, the RC technology file generated based on the process file is programmable. The programmable RC technology file, accordingly, is more readily adaptable to account for changes in an IC design and/or changes in process relayed to the IC designer by a foundry. This, in turn, speeds the generation of RC technology files, which expedites the IC design and production cycle.

Figure 2:
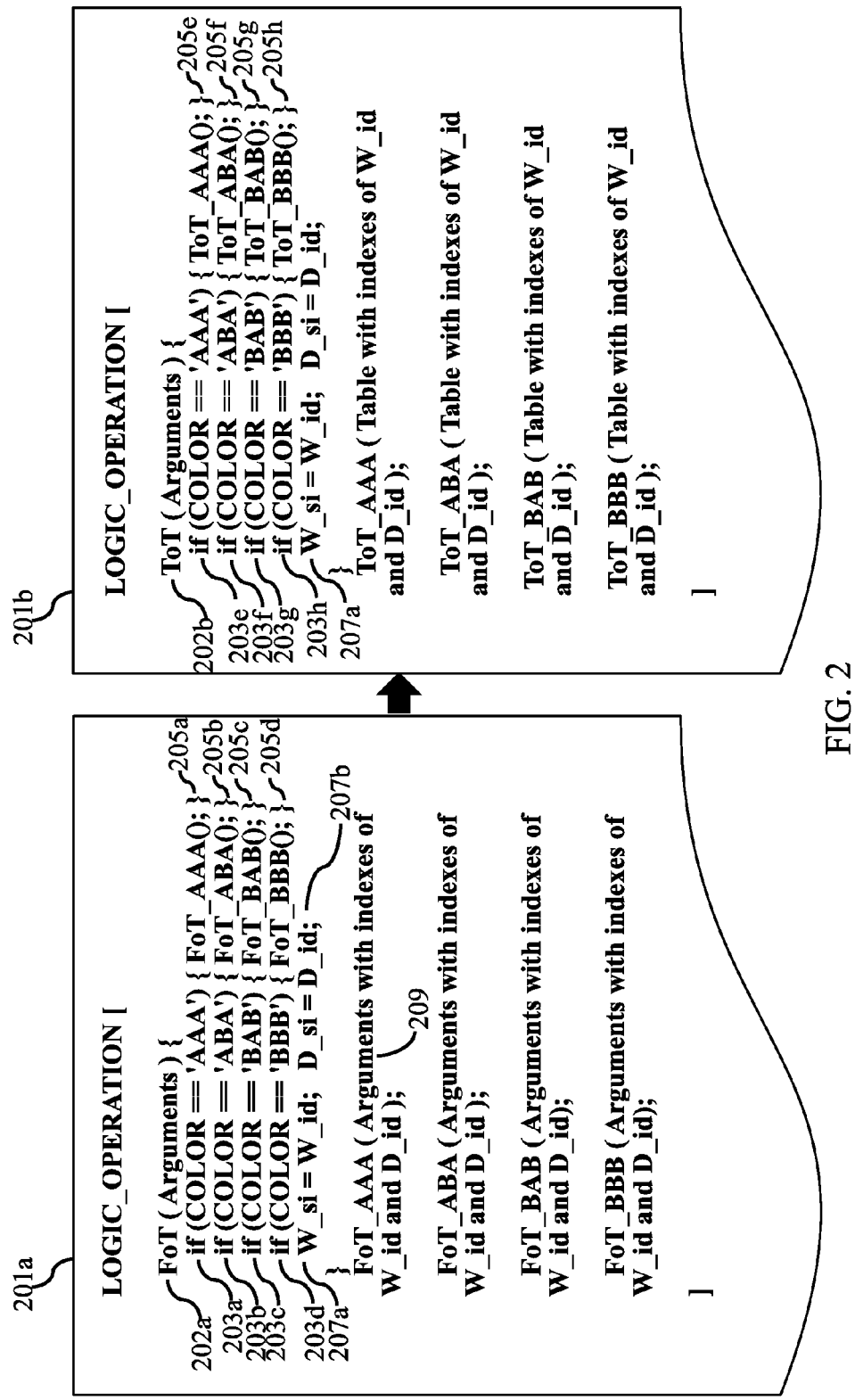
FIG. 2 is a diagram of a process file that is edited by way of a user interface, in accordance with one or more embodiments.

FIG. 2 is a diagram of a process file 201a that is edited by way of a user interface associated with a computer to become a process file 201b, in accordance with one or more embodiments.

Process file 201a is editable by way of a computer such as processor-based system 1100 (FIG. 11). In some embodiments, the computer is an EDA tool. In some embodiments, the computer is a RC tool. In other embodiments, the computer, by way of a processor, is configured to execute an EDA tool and/or a RC tool.

Process file 201a comprises a set of logic functions 202a that includes logic functions 203a-203d that are usable to determine a process parameter of a component of the IC. Each of the logic functions 203a-203d is associated with a process parameter extraction rule 205a-205d.

In this example, the determined process parameter is the thickness of a component of the IC. As such, the logic functions included in the set of logic functions 202a include function of thickness (FoT) process parameter extraction rules. For example, FoT_AAA is a process parameter extraction rule related to determining a thickness of a component based on a mask pattern "AAA." Similarly, the process file 201a optionally comprises one or more other logic functions or sets of logic functions that are directed to determining other process parameters such as a width of the component via function of width (FoW) process parameter extraction rules. For example, FoW_AAA, is process parameter extraction rule related to determining a width of the component based on a mask pattern "AAA." In some embodiments, process file 201a comprises one or more logic functions that are used to determine other process parameters such as length, thickness, density, position, or other suitable parameter used to fabricate one or more components of the IC. In some embodiments, one or more of the determined process parameters are used to determine other process parameters using one or more logic functions. For example, some process files 201a are configured to use a determined process parameter such as the thickness to determine the other process parameters using one or more other logic functions.

The logic functions 203a-203d are if/then statements that are computed based on a determined mask pattern attribute extracted from the layout of the IC. For example, if a mask pattern used to manufacture a designed IC is determined to be "AAA," then a processing of logic function 203a by the computer yields that process parameter extraction rule 205a (e.g., FoT_AAA) is to be used to determine the thickness of the component of the IC.

Process file 201a includes instructions 207a and 207b that instruct the computer whether to use a layout dimension (e.g. W_id) or a process dimension (e.g., W_si) for determining the thickness in this example. In process profile 201a, layout dimensions W_id and D_id are equal to process dimensions W_si and D_si. Accordingly, instructions 207a and 207b instruct the computer to use the layout dimensions W_id and D_id to determine the thickness of the component of the IC.

FoT_AAA is a process parameter extraction rule that instructs the computer to determine the thickness of the component of the IC using a process parameter determination function 209 and an index of layout dimensions_id. The index of layout dimensions is, for example, a searchable table that comprises thickness values that correspond with an output of the process parameter determination function 209 and the layout dimensions W_id and D_id. That is, the computer determines the thickness of the component of the IC by using the output of the process parameter determination function 209 and the layout dimensions W_id and D_id as search criteria. In some embodiments, process parameter extraction rule FoT_AAA, for example, is used to calculate the thickness of the component of the IC based on an algorithm that uses the attributes extracted from the layout of the IC and the layout dimensions W_id and D_id. In some embodiments, an output of process parameter extraction rule FoT_AAA is based on the layout dimensions W_id and D_id, and the output of the process parameter extraction rule FoT_AAA is used to search the index of layout dimensions W_id and D_id to determine the thickness of the component of the IC.

Process file 201b, in this example, includes all of the features included in process file 201a, such as a set of logic functions 202b that includes logic functions 203e-203h, process parameter extraction rules 205e-205h, and instructions 207c and 207d. Process file 201b differs from process file 201a in that the process parameter extraction rules 205e-205h are edited to be table-based rather than function-based. As such, the logic functions included in the set of logic functions 202b include table of thickness (ToT) process parameter extraction rules. For example, ToT_AAA is a process parameter extraction rule related to determining a thickness of a component based on mask pattern "AAA." Similarly, the process file 201a optionally comprises one or more other logic functions or sets of logic functions that are directed to determining other process parameters such as a width of the component via table of width (ToW) process parameter extraction rules. For example, ToW_AAA, is process parameter extraction rule related to determining a width of the component based on mask pattern "AAA."

In process file 201b, process parameter extraction rule 205e instructs the computer to determine the thickness of the component of the IC using a lookup table that matches the mask pattern AAA with the layout dimensions W_id and D_id, using the mask pattern AAA and the layout dimensions W_id and D_id as search criteria. In some embodiments, some process files 201b are configured to use a determined process parameter such as the thickness to determine the other process parameters using one or more other lookup tables.

In some embodiments, if the instruction to use the layout dimensions 207a and 207b instruct the computer to use process dimensions W_si and D_si, for example, then process parameter extraction rules 205a-205h would use an index of process dimensions _si instead of layout dimensions _id.

According to various embodiments, one or more of the logic functions 203a-203h or another logic function is editable by way of a user interface associated with the computer. In some embodiments, one or more of the process parameter extraction rules 205a-205h or another process parameter extraction rule is editable by way of the user interface associated with the computer. In some embodiments, one or more of the instructions 207a-207d to use a layout dimension _id or a process dimension _si is editable by way of the user interface associated with the computer. In some embodiments, one or more of the process parameter determination function 209 or another process parameter determination function is editable by way of the user interface associated with the computer. Process file 201a or 201b is capable of comprising any quantity of default logic functions, process parameter extraction rules, instructions, or other computer readable code that is capable of being edited by a user. Similarly, the process file 201a or 201b, in some embodiments, comprises a combination of FoT logic functions and ToT logic functions.

Figure 3:
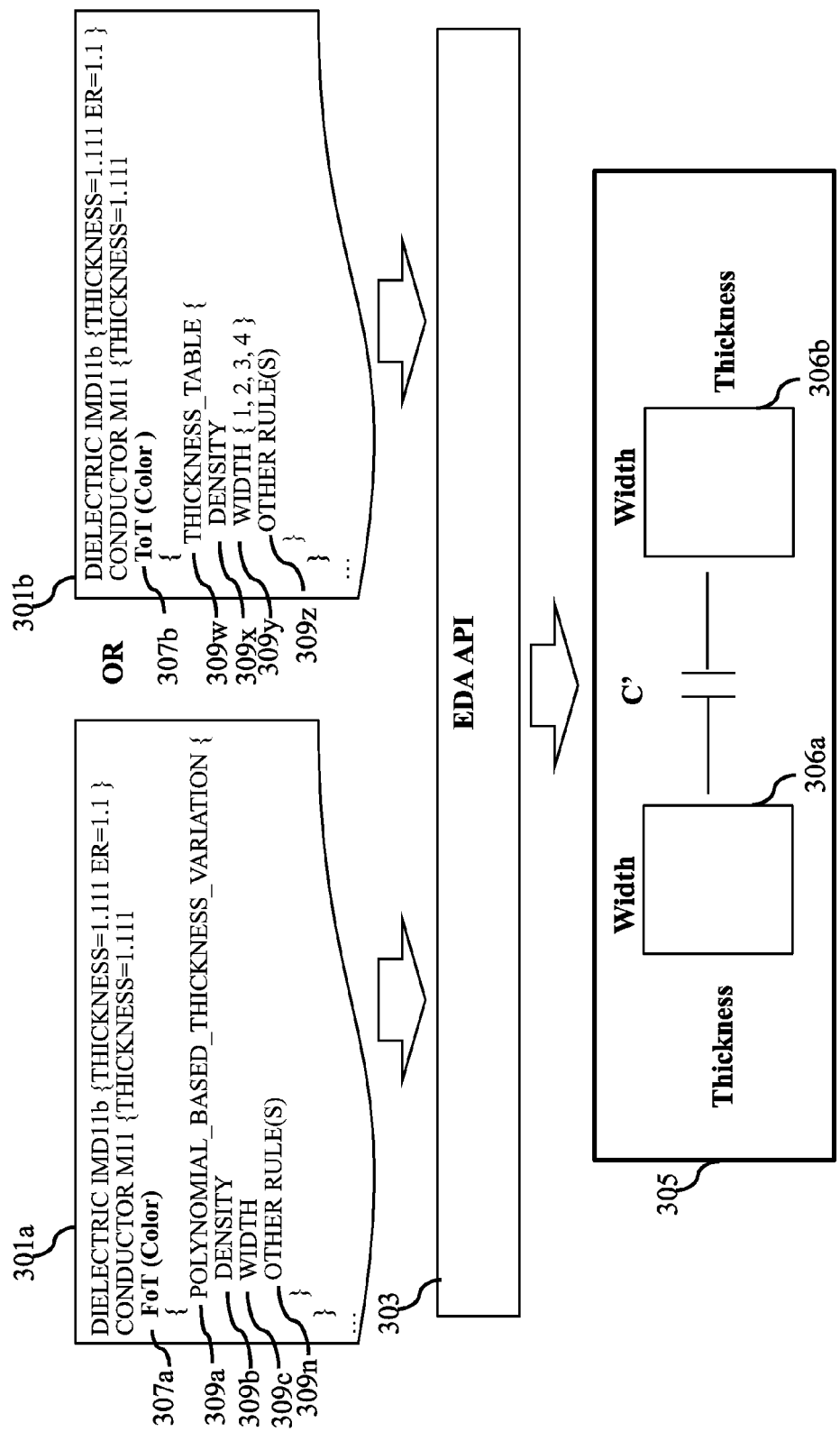
FIG. 3 is a flow chart of receipt of a process file by a computer by way of an application programming interface, in accordance with some embodiments.

FIG. 3 is a flow chart illustrating that a process file 301a or a process file 301b is received by a computer such as processor-based system 1100 (FIG. 11) by way of an EDA application programming interface (API) 303, in accordance with one or more embodiments. The received process file 301a or 301b is processed to generate an RC technology file 305 that comprises a capacitance value C' between at least two components 306a and 306b of the IC.

In this example embodiment, process file 301a includes a set of logic functions 307a that includes process parameter extraction rules 309a-309n that are function-based, like process parameter extraction rules 205a-205d (FIG. 2) of process file 201a (FIG. 2). The logic functions included in the set of logic functions 307a and the process parameter extraction rules 309a-309n are used to determine one or more process parameters based on a first determined process parameter, such as a determined thickness based on a determined mask color pattern.

Process file 301b includes a set of logic functions 307b that includes process parameter extraction rules 309w-309z that are table-based, like process parameter extraction rules 205e-205h (FIG. 2) of process file 201b (FIG. 2). The logic functions included in the set of logic functions 307b and the process parameter extraction rules 309w-309z are used to determine one or more process parameters based on a first determined process parameter, such as a determined thickness of the component of the IC.

For example, a thickness of a conductor M11 is determined using process file 201a (FIG. 2), and the thickness is based on a determined mask pattern AAA (see FIG. 2), then other process parameters such as a density, width, or polynomial-based thickness variation, are determined based on the determined thickness, using the process parameter extraction rules 309a-309n (which are optionally editable by a user input) included in the process file 301a. Alternatively, if a thickness of a conductor M11 is determined using process file 201b (FIG. 2), and the thickness is based on a determined mask pattern AAA (see FIG. 2), then other process parameters such as a density, width, or table-based thickness variation, are determined based on the determined thickness, using the process parameter extraction rules 309w-309z (which are optionally editable by a user input) included in the process file 301b.

The EDA API 303 is configured to receive process files 301a and/or 201a (FIG. 2) or process files 301b and/or 201b (FIG. 2), and uses the logic functions, process parameter extraction rules, process parameters and instructions included therein to determine one or more process parameters and to ultimately calculate a capacitance value C' between components 306a and 306b of the IC.

Based on a processing of the received process files, the EDA API 303 generates the RC technology file 305. The RC technology file 305 at least comprises the calculated capacitance value C' between components 306a and 306b of the IC. In some embodiments, the RC technology file 305 additionally comprises one or more process parameters such as the determined width or the determined thickness of the components 306a and 306b of the IC. In this example, at least some of the determined process parameters are based on the determined thickness of the components of the IC, which is based on the determined mask pattern extracted from the layout of the IC. As such, the capacitance C' is based on the determined thickness of the components of the IC, which is based on the determined mask pattern. For example, if a component is formed using a mask pattern AAA, the thickness of the component is calculated using FoT_AAA or ToT_AAA, and capacitance C' is calculated using the determined component thickness.

Figure 4:
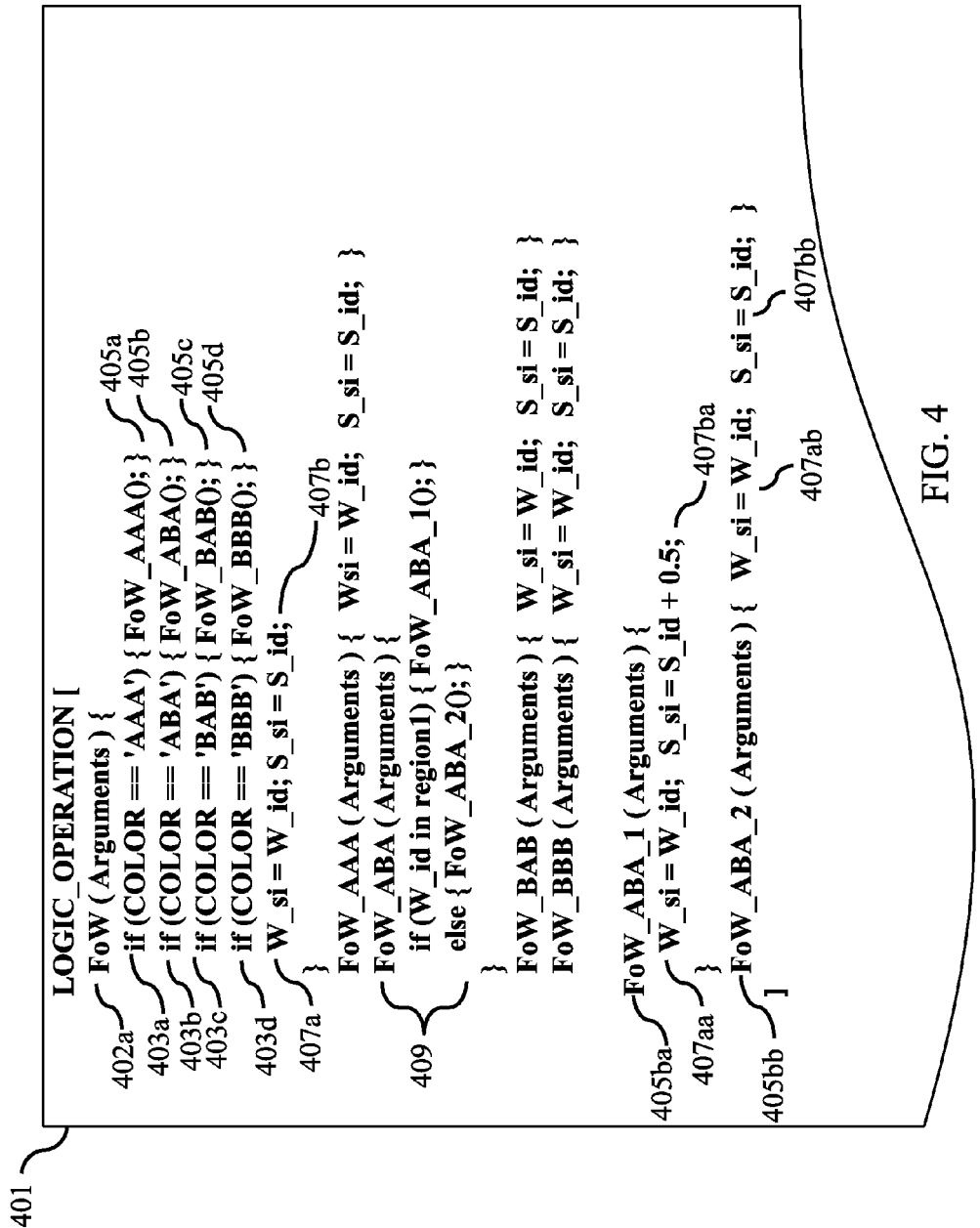
FIG. 4 is a diagram of a process file, in accordance with some embodiments.

FIG. 4 is a diagram of a process file 401, in accordance with one or more embodiments. Process file 401 comprises a set of logic functions 402a that includes logic functions 403a-403d that are used to determine a process parameter of a component of the IC. Each of the logic functions 403a-403d is associated with a process parameter extraction rule 405a-405d. In this example, logic functions 403a-403d are usable to determine a width of a component of the IC based on a determined mask pattern. In this example, process parameter extractions rules 405a-405d are function based rules like process parameter extraction rules 205a-205d (FIG. 2). Process parameter extraction rule 405b, in this example, comprises sub-rules 405ba and 405bb that yield different sets of instructions 407aa/407ba, and 407ab/407bb, for using the layout dimensions _id or the process dimensions _si.

For example, if the computer determines that the mask pattern is "ABA," logic function 403b yields that process parameter extraction rule 405b should be used to determine the width of the component of the IC. Then, the computer determines if the component is in a first region 1 of the IC, as instructed in process parameter extraction rule FoW_ABA (i.e., process parameter extraction rule 405b, the details of which are indicated by reference number 409). If an attribute extracted from the layout of the IC indicates that the component is in region 1, then sub-rule 405ba is used to determine the width of the component. If an attribute determined from the layout of the IC indicates that the component is not in region 1, then sub-rule 405bb is used to determine the width of the component.

If sub-rule 405ba is used to determine the width of the component, then the instruction 407aa indicates that process width W_si and layout width W_id are equal, and instruction 407ba indicates that process spacing S_si and layout spacing S_id are different. As such, instructions 407aa and 407ba instruct the computer to use process dimensions _si in subsequent operations used to determine another process parameter or the capacitance value. Alternatively, instructions 407ab and 407bb instruct the computer to modify layout dimensions _id based on the difference between the spacing S_si and S_id, and the computer uses the layout dimensions _id in subsequent operations.

If sub-rule 405bb is used to determine the width of the component, then instructions 407ab and 407bb indicate that process width W_si and layout width W_id are equal, and spacing S_si and layout spacing S_id are equal. As such, instructions 407ab and 407bb instruct the computer to use layout dimensions _id in subsequent operations.

One or more of the logic functions 403a-403d, the process parameter extraction rules 405a-405d, the sub-rules 405aa-405ab, the instructions 407aa-407ab, or process parameters such as the process dimensions _si are editable based on a user input. For example, if an IC design is changed, and a process variation occurs based on the design change, the relationship between the process dimensions _si and the layout dimensions _id is optionally edited to improve a correlation between the layout dimensions _id and the process dimensions _si for increasing the accuracy of the capacitance value determination, or other process parameter determination. In some embodiments, the process file 401 is edited to include table-based logic functions such as those discussed with respect to process file 201*b* (FIG. 2), or the process file 401 includes table-based logic functions as a default.

In some embodiments, the capacitance value C' (FIG. 3) is calculated based on one or more process parameters that are determined based on the determined width of the component of the IC. For example, a component thickness W_aba_1 is calculated by FoW_ABA_1 or ToW_ABA_1 (i.e., a table based function for determining the width of the component) if the mask color pattern is ABA and the component is determined to be in region 1. As such, if a RC technology file such as RC technology file 305 (FIG. 3) that includes a capacitance value C', which is based on the determined width, then the capacitance value C' is calculated using component width W_aba_1, in this example.

Figure 5:
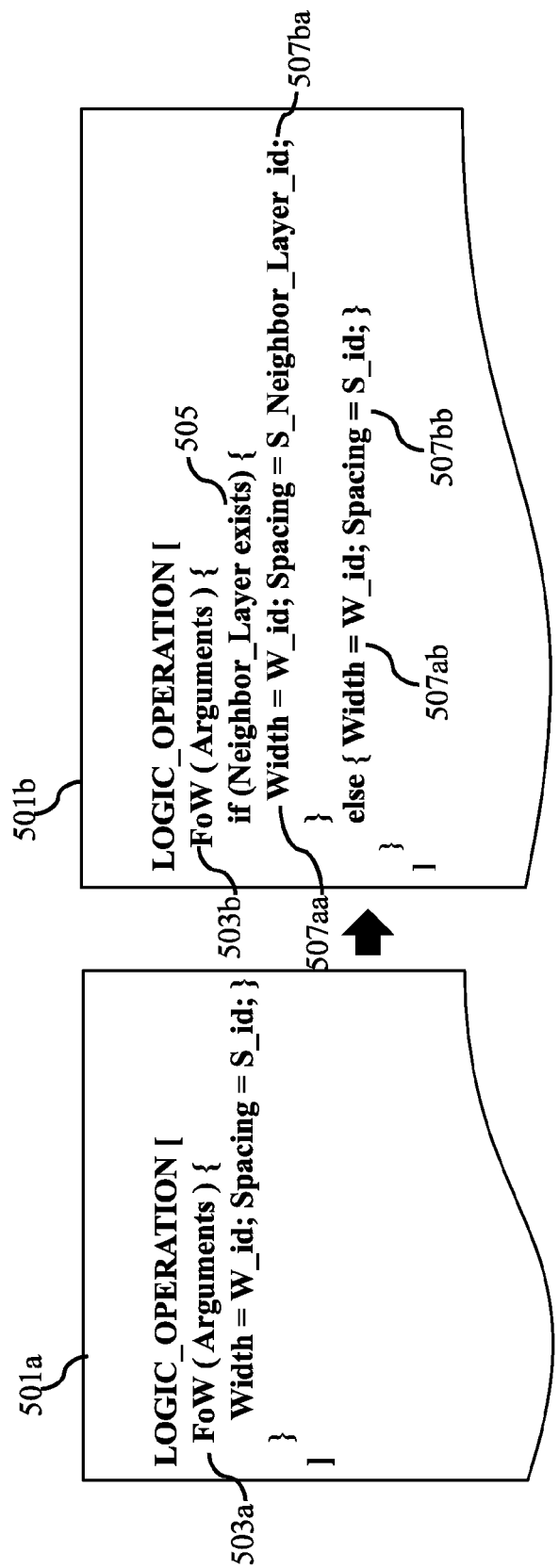
FIG. 5 is a diagram of a process file that is edited by way of a user interface, in accordance with some embodiments.

FIG. 5 is a diagram of a process file 501*a* that is edited to become process file 501*b*, in accordance with one or more embodiments.

Process file 501*a* is edited by way of a computer such as processor-based system 1100 (FIG. 11). In some embodiments, the computer is an EDA tool. In some embodiments, the computer is a RC tool. In other embodiments, the computer, by way of a processor, is configured to execute an EDA tool and/or a RC tool.

Process file 501*a* includes a logic function 503*a*, which is a function of width FoW logic function that is used by the computer to determine the width of a component of the IC and a spacing between two components of the IC. Process file 501*a* is a default process file. If a design specification of the IC is changed, the process file 501*a* is optionally editable by way of a user input to include logic functions that consider whether a certain layer in the IC exists. For example, process file 501*b* includes a logic function 503*b* that provides a process parameter determination rule 505 that the computer uses to compare whether and if the layer exists, and based on the comparison, a set of instructions 507*aa*/507*ba* or a set of instructions 507*ab*/507*bb* is used for determining the width and the spacing. For example, if a neighboring layer exists, then the width used by the computer for subsequent operations is W_id and the spacing used by the computer for subsequent operations is a predefined spacing S_Neighbor_Layer_id. If the neighboring layer does not exist, then the width is the layout width W_id and the spacing is the layout spacing S_id. In some embodiments, the edited logic function 503*b* includes an instruction that specifies that the spacing S_Neighbor_Layer_id is applicable in one of an X-direction or a Y-direction.

In some embodiments, instead of a function of width FoW function, the process file 501*b* comprises a table of width ToW function such as ToW (Neighbor_Layer=PO), which is used by the computer to search a table for one or more width, spacing, or etch values for use by the computer in a subsequent operation.

Figure 6:
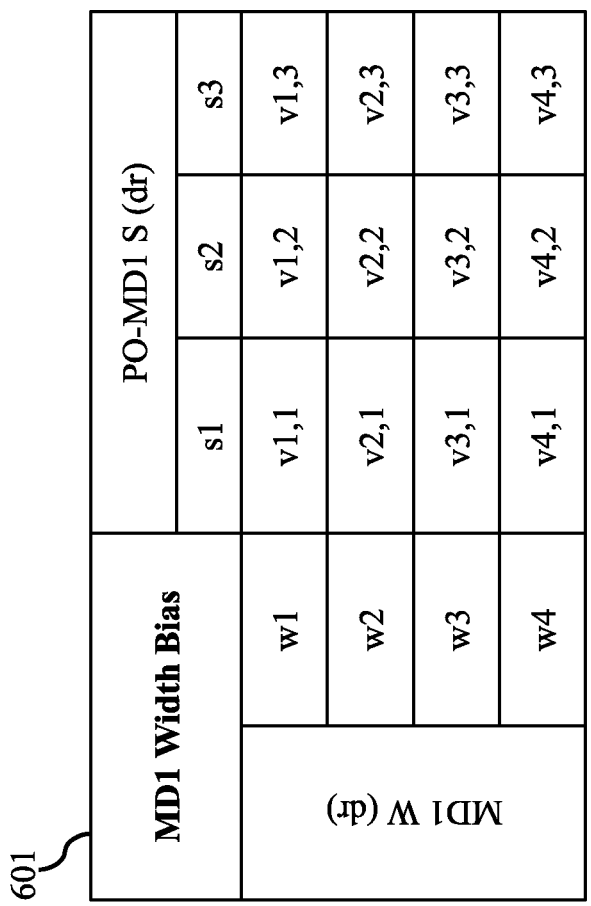
FIG. 6 is a table usable by a computer for executing a table of width (ToW) function, in accordance with some embodiments.

FIG. 6 is a table 601 usable by a computer that executes a table of width ToW function if a neighbor layer is determined to exist, in accordance with one or more embodiments. Table 601 is usable by a computer such as processor-based system 1100 (FIG. 11). Table 601 comprises width values, spacing values, and etch values. The computer uses one or more logic functions included in a process file such as process file 501*b* (FIG. 5) to determine the width, the spacing, or an etch value v based on a search of the table 601 using two of the width, the spacing and the etch value v. Etch value v, for example, is a process parameter such as an etch depth into a layer of the IC, or a timing associated with an etching process used to manufacture the IC.

Figure 7:
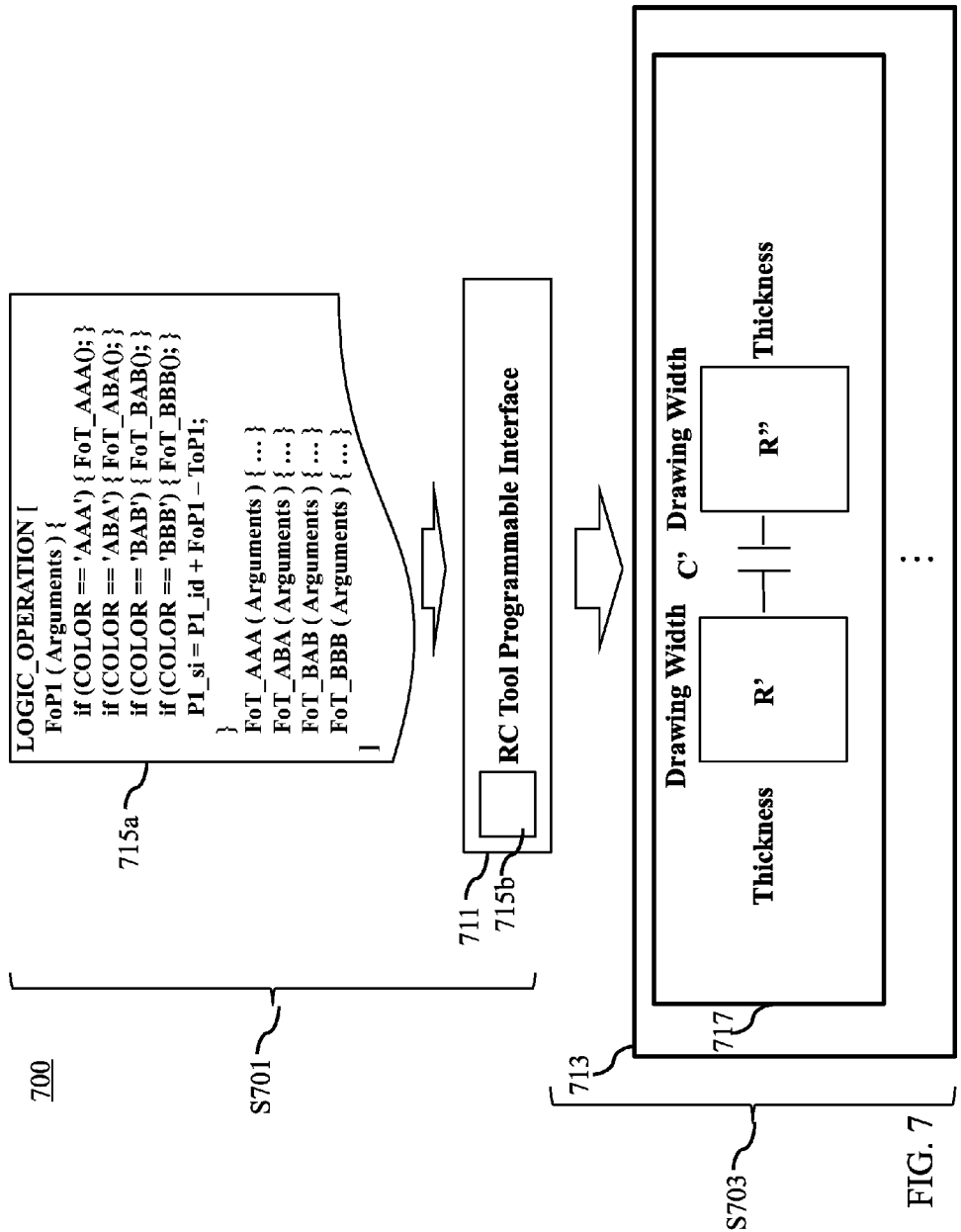
FIG. 7 is a flow chart of a method in which a RC tool programmable interface is used to generate a table of RC technology files, in accordance with some embodiments.

FIG. 7 is a flow chart of a method 700 executed by a computer in which a RC tool programmable interface 711 is used to generate a table of RC technology files 713, in accordance with one or more embodiments.

Method 700 is performed by a computer such as processor-based system 1100 (FIG. 11). In some embodiments, the computer is an EDA tool. In some embodiments, the computer is a RC tool. In other embodiments, the computer, by way of a processor, is configured to execute an EDA tool and/or a RC tool.

RC tool programmable interface 711 is associated with the computer. RC tool programmable interface 711 is configured to receive a user input to edit and/or finalize a process file 715*a* received by the RC tool programmable interface 711 and to generate a finalized process file 715*b*. As such, in step S701, RC tool programmable interface 711 generates finalized process file 715*b* based on a user input received by way of a user interface associated with the computer. Process file 715*a* is similar to process file 201*a* (FIG. 2).

In step S703, the computer then generates a RC technology file 717 based on the logic functions, rules and instructions included in the finalized process file 715*b*. RC technology file 717 is similar to RC technology file 305 (FIG. 3).

The computer generates a plurality of RC technology files 717 that each comprise capacitance values for various combinations of layout dimensions, process dimensions, process parameters, and/or other component attributes such as mask patterns that are included in an index defined in the process file 715*a* or the finalized process file 715*b*. The RC technology files 717 of the plurality of RC technology files 717 are stored in the table of RC technology files 713. In some embodiments, the capacitance values included in the RC technology files 717 are extracted by the computer in a subsequent process.

In some embodiments, one or more of the RC technology files includes capacitance values that are based on one or more attributes or process parameters that are provided in a layout of the IC, process file 715*a*, or that are provided to the RC tool programmable interface 711 by way of a user input.

Figure 8:
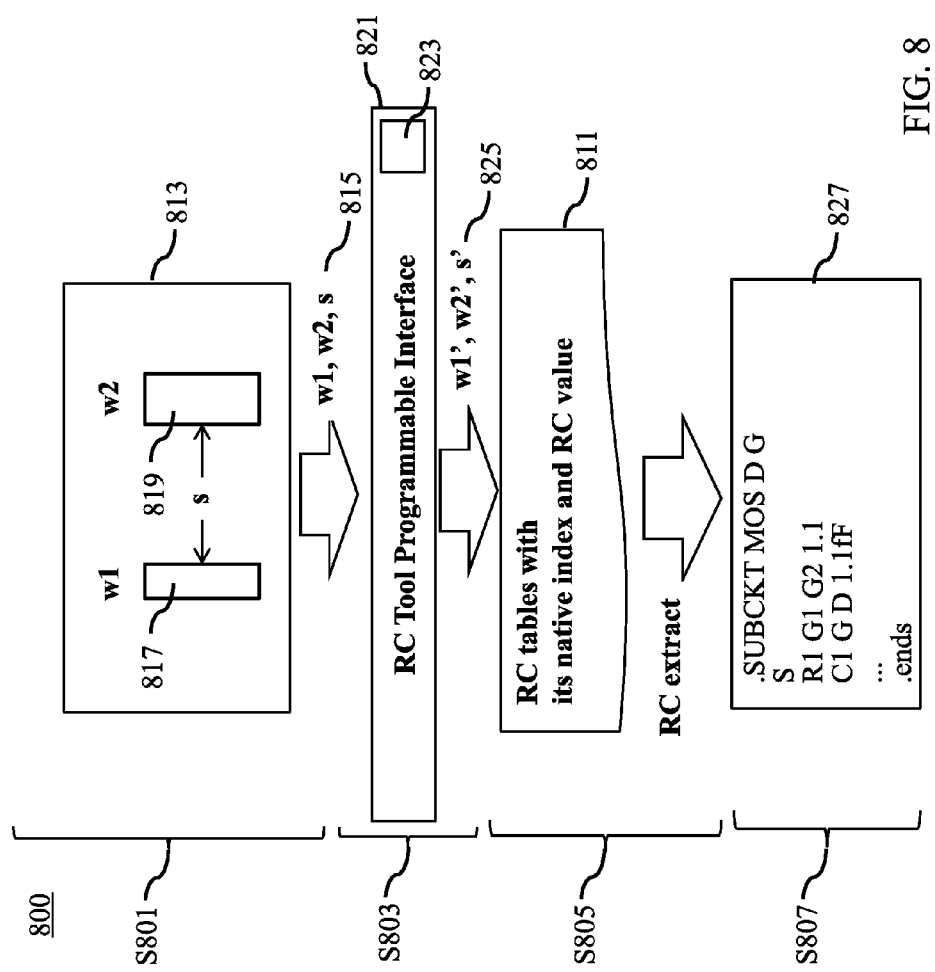
FIG. 8 is a flow chart of a method of generating a netlist using a table of RC technology files, in accordance with some embodiments.

FIG. 8 is a flow chart of a method 800 executed by a computer to generate a netlist using a table of RC technology files 811, in accordance with one or more embodiments. The table of RC technology files 811 is similar to the table of RC technology files 713 generated in FIG. 7.

Method 800 is performed by a computer such as processor-based system 1100 (FIG. 11). In some embodiments, the computer is an EDA tool. In some embodiments, the computer is a RC tool. In other embodiments, the computer, by way of a processor, is configured to execute an EDA tool and/or a RC tool.

In step S801, the computer processes a layout file 813 of an IC to determine one or more attributes 815 of the components 817 and 819 of the IC. The processing of layout file 813 yields attributes 815 that include a layout width w1 of component 817, a layout width w2 of component 819, and a spacing S between component 817 and component 819.

In step S803, the computer, executes the RC tool programmable interface 821 to process a finalized process file 823 to determine one or more process parameters 825 that include a process width w1' of component 817, a process width w2' of component 819, and a process spacing S' between component 817 and component 819 based on the logic functions, rules and instructions included in finalized process file 823. Finalized process file 823 is similar to finalized process file 715*b* generated in FIG. 7.

In step S805, the computer searches the table of RC technology files 811 to extract a corresponding capacitance value from the table of RC technology files 811 based on the process parameters 825 by using the process parameters 825 as search criteria.

In step S807, the computer generates a netlist 827 that describes one or more connections between component 817 and component 819 and comprises the extracted capacitance value.

In some embodiments, the computer is configured to generate instructions that are usable for forming a mask or for manufacturing the IC based on the netlist 827 generated in step S807.

Figure 9:
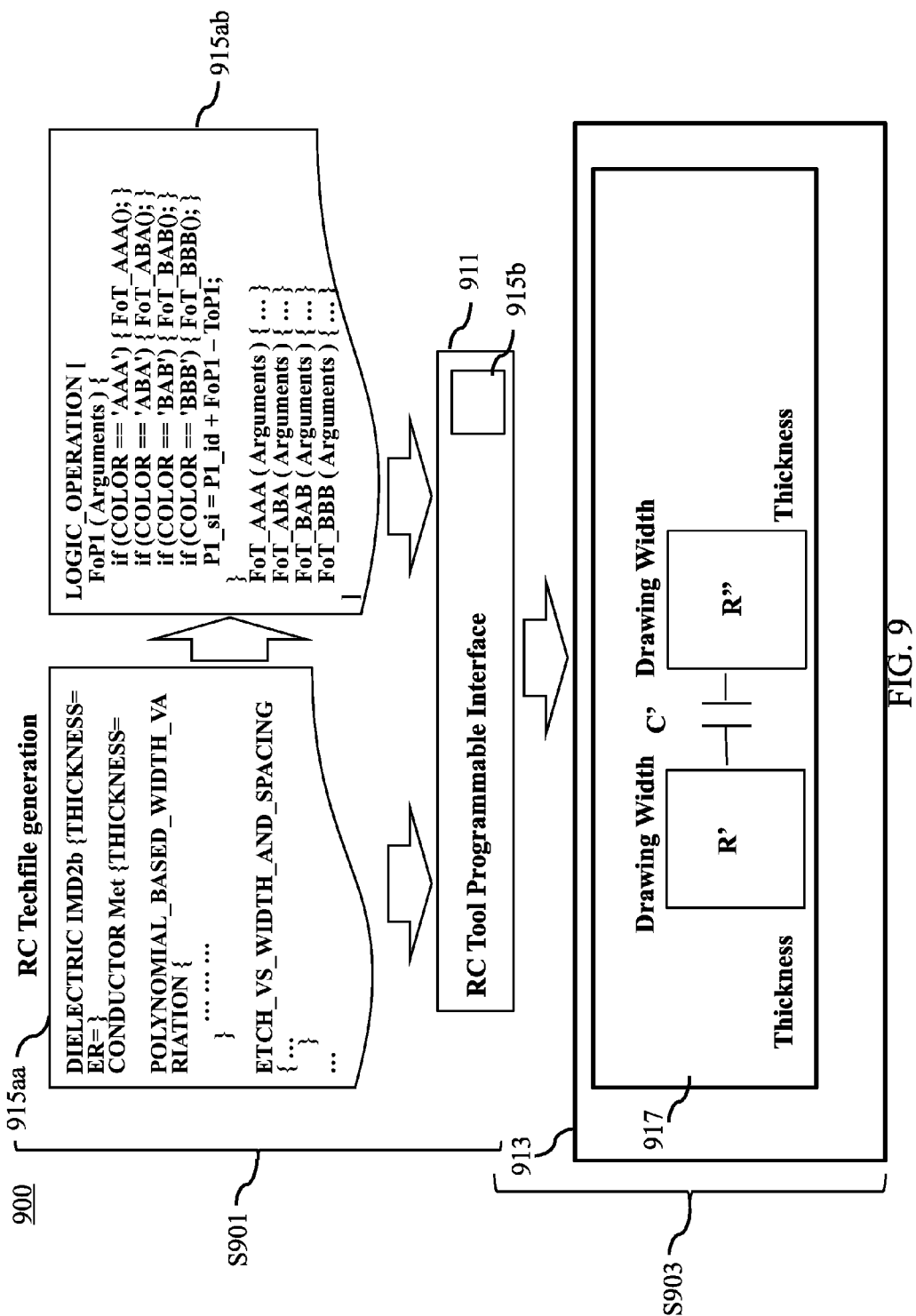
FIG. 9 is a flow chart of a method in which a RC tool programmable interface is used to generate a table of RC technology files, in accordance with some embodiments.

FIG. 9 is a flow chart of a method 900 executed by a computer in which a RC tool programmable interface 911 is used to generate a table of RC technology files 913, in accordance with one or more embodiments.

Method 900 is performed by a computer such as processor-based system 1100 (FIG. 11). In some embodiments, the computer is an EDA tool. In some embodiments, the computer is a RC tool. In other embodiments, the computer, by way of a processor, is configured to execute an EDA tool and/or a RC tool.

RC tool programmable interface 911 is similar to RC tool programmable interface 711 discussed in FIG. 7. RC tool programmable interface 911 is configured to receive a user input to edit and/or finalize a process file 915aa received by the RC tool programmable interface 911. In some embodiments, RC tool programmable interface 911 is configured to receive and decrypt or execute a user-defined file that comprises one or more process parameters, logic functions or instructions in an encrypted format. In some embodiments, RC tool programmable interface 911 is configured to generate a finalized process file 915b based on the process file 915aa and the user-defined file 915ab. As such, in step S901, RC tool programmable interface 911 generates finalized process file 915b based on a user input received by way of a user interface associated with the computer and based on an output of the user-defined file 915ab. Process file 915aa is similar to process file 201a (FIG. 2).

In step S903, the computer then generates a RC technology file 917 based on the process parameters, logic functions, rules and instructions included in the finalized process file 915b. RC technology file 917 is similar to RC technology file 305 (FIG. 3).

The computer generates a plurality of RC technology files 917 that each comprise capacitance values for various combinations of layout dimensions, process dimensions, process parameters, and/or other component attributes such as mask patterns that are included in an index defined in the process file 915aa, the user-defined file 915ab, or the finalized process file 915b. The RC technology files 917 of the plurality of RC technology files 917 are stored in the table of RC technology files 913. In some embodiments, the capacitance values included in the RC technology files 917 are extracted by the computer in a subsequent process.

In some embodiments, one or more of the RC technology files 917 includes capacitance values that are based on one or more attributes or process parameters that are provided in a layout of the IC, process file 915aa, user-defined file 915ab, or that are provided to the RC tool programmable interface 911 by way of a user input.

Figure 10:
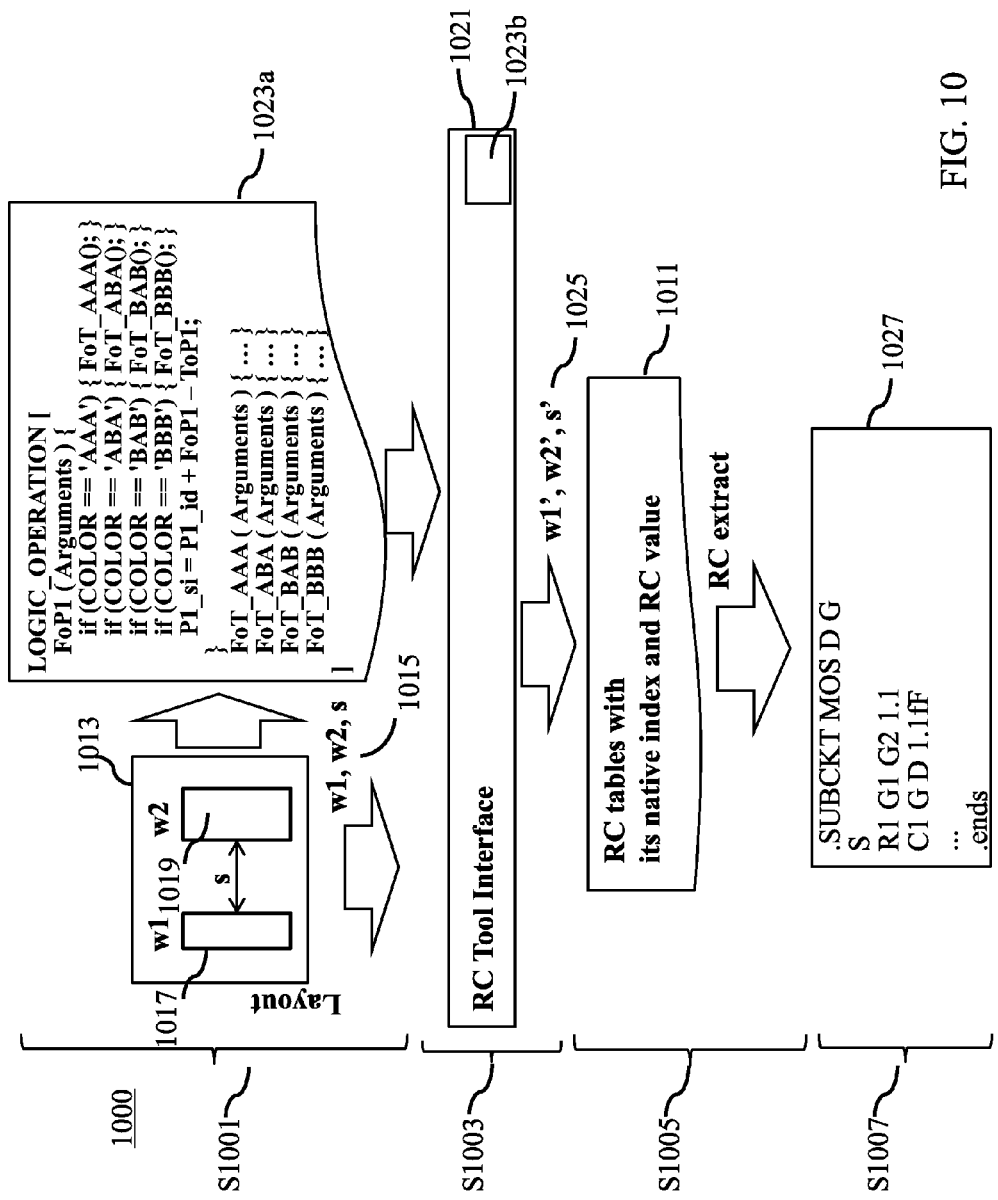
FIG. 10 is a flow chart of a method of generating a netlist using a table of RC technology files, in accordance with some embodiments.

FIG. 10 is a flow chart of a method 1000 executed by a computer to generate a netlist using a table of RC technology files 1011, in accordance with one or more embodiments.

Method 1000 is performed by a computer such as processor-based system 1100 (FIG. 11). In some embodiments, the computer is an EDA tool. In some embodiments, the computer is a RC tool. In other embodiments, the computer, by way of a processor, is configured to execute an EDA tool and/or a RC tool. The table of RC technology files 1011 is similar to the table of RC technology file 913 generated in FIG. 9.

In step S1001, the computer processes a layout file 1013 of an IC to determine one or more attributes 1015 of the components 1017 and 1019 of the IC. The processing of layout file 1013 yields attributes 1015 that include a layout width w1 of component 1017, a layout width w2 of component 1019, and a spacing S between component 1017 and component 1019.

In step S1003, the computer, executes the RC tool programmable interface 1021 to decrypt or execute a user-defined file 1023a that comprises one or more process parameters, logic functions or instructions in an encrypted format, and to modify a finalized process file 1023b based on an output of the user-defined file 1023a. An output of the user-defined file 1023a is based on one or more of the attributes 1015. Finalized process file 1023b is similar to finalized process file 915b generated in FIG. 9, but is modified to account for process parameters, logic functions, instructions, or rules that are included in the user defined file 1023a. As such, in step S1003, the RC tool programmable interface 1021 executes the modified finalized process file 1023b to determine one or more process parameters 1025 that include a process width w1' of component 1017, a process width w2' of component 1019, and a process spacing S' between component 1017 and component 1019 based on the logic functions, rules and instructions included in finalized process file 1023.

In step S1005, the computer searches the table of RC technology files 1011 to extract a corresponding capacitance value from the table of RC technology files 1011 based on the process parameters 1025 by using the process parameters 1025 as search criteria.

In step S1007, the computer generates a netlist 1027 that describes one or more connections between component 1017 and component 1019 and comprises the extracted capacitance value.

In some embodiments, the computer is configured to generate instructions that are usable for forming a mask or for manufacturing the IC based on the netlist 1027 generated in step S1007.

FIG. 11 is a functional block diagram of a computer or processor-based system 1100 upon which or by which an embodiment is implemented.

Processor-based system 1100 is programmable to generate a programmable RC technology file and/or generate a netlist based on a programmable RC technology file, as described herein, and includes, for example, bus 1101, processor 1103, and memory 1105 components.

In some embodiments, the processor-based system is implemented as a single "system on a chip." Processor-based system 1100, or a portion thereof, constitutes a mechanism for designing a memory circuit. In some embodiments, the processor-based system 1100 includes a communication mechanism such as bus 1101 for transferring information and/or instructions among the components of the processor-based system 1100. Processor 1103 is connected to the bus 1101 to obtain instructions for execution and process information stored in, for example, the memory 1105. In some embodiments, the processor 1103 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 1103. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 1103 performs a set of operations on information as specified by a set of instructions stored in memory 1105 related to generating a programmable RC technology file and/or generate a netlist based on a programmable RC technology file. The execution of the instructions causes the processor to perform specified functions.

The processor 1103 and accompanying components are connected to the memory 1105 via the bus 1101. The memory 1105 includes one or more of dynamic memory (e.g., RAM, magnetic disk, writable optical disk, etc.) and static memory (e.g., ROM, CD-ROM, etc.) for storing executable instructions that when executed perform the steps described herein to generate a programmable RC technology file and/or generate a netlist based on a programmable RC technology file. The memory 1105 also stores the data associated with or generated by the execution of the steps.

In one or more embodiments, the memory 1105, such as a random access memory (RAM) or any other dynamic storage device, stores information including processor instructions for generating a programmable RC technology file and/or generate a netlist based on a programmable RC technology file. Dynamic memory allows information stored therein to be changed. RAM allows a unit of information stored at a location called a memory address to be stored and retrieved independently of information at neighboring addresses. The memory 1105 is also used by the processor 1103 to store temporary values during execution of processor instructions. In various embodiments, the memory 1105 is a read only memory (ROM) or any other static storage device coupled to the bus 1101 for storing static information, including instructions, that is not changed. Some memory is composed of volatile storage that loses the information stored thereon when power is lost. In some embodiments, the memory 1105 is a non-volatile (persistent) storage device, such as a magnetic disk, optical disk or flash card, for storing information, including instructions, that persists even when power supplied to the memory 1105 is turned off.

The term "computer-readable medium" as used herein refers to any medium that participates in providing information to processor 1103, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this description relates to a method that comprises processing a layout of an integrated circuit to determine one or more attributes of one or more components of the integrated circuit. The method also comprises extracting one or more process parameters from a process file associated with manufacturing the integrated circuit. The one or more process parameters are extracted from the process file based on a computation of one or more logic functions. At least one of the one or more logic functions is included in the process file. The computation is based on the one or more attributes. The method further comprises calculating a capacitance value between at least two components of the integrated circuit based on the one or more process parameters and a capacitance determination rule included in the process file. At least one of the one or more process parameters, the one or more logic functions, or the capacitance determination rule is editable based on a user input. At least one of the above steps is performed by a hardware computer.

Another aspect of this description relates to method of generating a netlist describing an integrated circuit. The method comprises processing a layout of an integrated circuit to determine one or more attributes of one or more components of the integrated circuit. The method also comprises extracting a first process parameter from a process file associated with manufacturing the integrated circuit. The first process parameter is extracted from the process file based on a computation of a first logic function included in the process file. The computation is based on the one or more attributes. The method further comprises executing an encrypted data file having a second process parameter associated with manufacturing the integrated circuit. The second process parameter is encrypted. The method additionally comprises calculating a capacitance value between at least two components of the integrated circuit using an output of the executed encrypted data file based on the second process parameter. The method also comprises generating a netlist describing one or more connections between the one or more components. The netlist comprises the capacitance value. At least one of the above steps is performed by a hardware computer.

A further aspect of this description relates to a method of generating a resistance capacitance technology file. The method comprises processing a layout of an integrated circuit to determine one or more attributes of one or more components of the integrated circuit. The method also comprises extracting a first process parameter from a process file associated with manufacturing an integrated circuit. The first process parameter is extracted from the process file based on a computation of a first logic function included in the process file. The computation is based on the one or more attributes. The method further comprises adding a second process parameter to the process file by way of a user input. The second process parameter is readable by a resistance capacitance tool. The method additionally comprises executing an encrypted data file having a third process parameter associated with manufacturing the integrated circuit. The third process parameter is encrypted. The method also comprises calculating a capacitance value between at least two components of the integrated circuit using an output of the executed encrypted data file based on the third process parameter and the first process parameter. The method further comprises generating the resistance capacitance technology file. The resistance capacitance technology file comprises the first process parameter, the second process parameter, the third process parameter, and the capacitance value. At least one of the above steps is performed by a hardware computer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
processing a layout of an integrated circuit to determine one or more attributes of one or more components of the integrated circuit;
extracting one or more process parameters from a process file associated with manufacturing the integrated circuit, wherein the one or more process parameters are extracted from the process file based on a computation of one or more logic functions, at least one of the one or more logic functions is included in the process file, and the computation is based on the one or more attributes;
calculating a capacitance value between at least two components of the integrated circuit based on the one or more process parameters and a capacitance determination rule included in the process file; and
generating a resistance capacitance technology file based on the extracted one or more process parameters,
wherein at least one of the one or more process parameters, the one or more logic functions, or the capacitance determination rule is editable based on a user input, and at least one of the above steps is performed by a hardware computer.

2. The method of claim 1, wherein determining the one or more attributes comprises determining a layout dimension of at least one of the one or more components, and extracting the one or more process parameters comprises using the layout dimension for extracting at least one of the one or more process parameters or for calculating the capacitance value.

3. The method of claim 2, wherein extracting the one or more process parameters comprises:
using a process dimension of the at least one of the one or more components for extracting at least one of the one or more process parameters or for calculating the capacitance value, wherein the process dimension is included in the process file; and
selectively replacing the layout dimension with the process dimension.

4. The method of claim 1, wherein the capacitance determination rule used to determine the capacitance value is one of a first capacitance determination rule or a second capacitance determination rule, and the calculating the capacitance value comprises:
using the first capacitance determination rule to calculate the capacitance value using a capacitance determination function, or
using the second capacitance determination rule to calculate the capacitance value based on an index of capacitance values.

5. The method of claim 4, further comprising:
applying the first capacitance determination rule or the second capacitance determination rule based the computation of the one or more logic functions included in the process file.

6. The method of claim 1, wherein determining the one or more attributes comprises using a mask pattern used to manufacture the one or more components.

7. The method of claim 6, wherein extracting the one or more process parameters comprises extracting a width of each component of the one or more components.

8. The method of claim 6, wherein extracting the one or more process parameters comprises extracting a thickness of each component of the one or more components.

9. The method of claim 1, wherein extracting the one or more process parameters comprises extracting at least one process parameter of the one or more process parameters based on a first parameter extraction rule or a second parameter extraction rule, the first parameter extraction rule instructs the at least one hardware computer to determine the at least one process parameter using a lookup table, and the second process parameter extraction rule instructs the at least one hardware computer to determine the at least one process parameter using a process parameter determination function.

10. The method of claim 1, wherein processing the layout comprises using a resistance capacitance tool as the at least one hardware computer, and the one or more process parameters, the one or more logic functions, or the capacitance determination rule comprises computer code readable by the resistance capacitance tool.

11. The method of claim 1, wherein extracting the one or more process parameters comprises extracting at least one encrypted process parameter, and the method further comprises:
generating an index of capacitance values based on the at least one encrypted process parameter,
wherein the capacitance determination rule used to determine the capacitance value instructs the at least one hardware computer to calculate the capacitance value based on the index of capacitance values.

12. The method of claim 11, wherein extracting the one or more process parameters comprises extracting at least one process parameter of the one or more process parameters using at least one encrypted logic function.

13. The method of claim 1, further comprising:
generating a netlist describing one or more connections between the one or more components,
wherein the netlist comprises the capacitance value.

14. A method of generating a netlist describing an integrated circuit, the method comprising:
processing a layout of an integrated circuit to determine one or more attributes of one or more components of the integrated circuit;
extracting a first process parameter from a process file associated with manufacturing the integrated circuit, wherein the first process parameter is extracted from the process file based on a computation of a first logic function included in the process file, and the computation is based on the one or more attributes;
executing an encrypted data file having a second process parameter associated with manufacturing the integrated circuit, wherein the second process parameter is encrypted;

calculating a capacitance value between at least two components of the integrated circuit using an output of the executed encrypted data file based on the second process parameter; and generating a netlist describing one or more connections between the one or more components, wherein the netlist comprises the capacitance value, and at least one of the above steps is performed by a hardware computer.

15. The method of claim 14, further comprising:

generating an index of capacitance values using the output of the executed encrypted data file based on the second process parameter, wherein the capacitance value is calculated based on the index of capacitance values and the first process parameter.

16. The method of claim 14, wherein executing the encrypted data file comprises executing the encrypted data file comprising a second logic function, and the method further comprises:

executing the encrypted data file to generate a logic function output based on the second logic function, wherein the second process parameter or a third process parameter is based on the logic function output.

17. The method of claim 14, wherein determining the one or more attributes comprises determining the first logic function based on a mask pattern.

18. The method of claim 14, wherein processing the layout comprises using a resistance capacitance tool as the at least one hardware computer, and the output of the executed encrypted data file comprises computer code readable by the resistance capacitance tool.

19. The method of claim 14, wherein extracting the first process parameter includes extracting a selectively editable first process parameter, or using a selectively editable first logic function.

20. A method of generating a resistance capacitance technology file, the method comprising:

processing a layout of an integrated circuit to determine one or more attributes of one or more components of the integrated circuit;

extracting a first process parameter from a process file associated with manufacturing an integrated circuit, wherein the first process parameter is extracted from the process file based on a computation of a first logic function included in the process file, and the computation is based on the one or more attributes;

adding a second process parameter to the process file by way of a user input, wherein the second process parameter is readable by a resistance capacitance tool;

executing an encrypted data file having a third process parameter associated with manufacturing the integrated circuit, wherein the third process parameter is encrypted;

calculating a capacitance value between at least two components of the integrated circuit using an output of the executed encrypted data file based on the third process parameter and the first process parameter; and generating the resistance capacitance technology file, wherein the resistance capacitance technology file comprises the first process parameter, the second process parameter, the third process parameter, and the capacitance value, and at least one of the above steps is performed by a hardware computer.

* * * * *